(12) United States Patent
Lee

(10) Patent No.: US 11,309,833 B2
(45) Date of Patent: Apr. 19, 2022

(54) LC OSCILLATOR CAPABLE OF TEMPERATURE COMPENSATION

(71) Applicant: WAVEPIA CO., LTD., Gyeonggi-do (KR)

(72) Inventor: Sang-Hun Lee, Gyeonggi-do (KR)

(73) Assignee: WAVEPIA CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/860,661

(22) Filed: Apr. 28, 2020

(65) Prior Publication Data

US 2020/0350860 A1 Nov. 5, 2020

(30) Foreign Application Priority Data

May 2, 2019 (KR) .................. 10-2019-0051422

(51) Int. Cl.
*H03B 5/04* (2006.01)
*H03B 5/12* (2006.01)

(52) U.S. Cl.
CPC ............. *H03B 5/04* (2013.01); *H03B 5/1212* (2013.01)

(58) Field of Classification Search
CPC ...................................................... H03B 5/04
USPC ......................................................... 331/66
See application file for complete search history.

(56) References Cited

U.S. PATENT DOCUMENTS

| 6,225,871 | B1* | 5/2001 | Chien | H03B 5/1228 331/117 FE |
| 7,307,486 | B2* | 12/2007 | Pernia | H03B 5/04 331/117 FE |
| 7,511,589 | B2* | 3/2009 | Tarng | H03H 9/173 331/117 R |
| 8,076,985 | B2* | 12/2011 | Tsukizawa | H03L 1/022 331/176 |
| 8,089,324 | B2* | 1/2012 | Tarng | H03B 5/04 331/117 FE |
| 8,093,957 | B1* | 1/2012 | Zhang | H03B 5/1293 331/177 V |
| 8,841,975 | B2* | 9/2014 | Nakamura | H03L 7/02 331/177 V |
| 2010/0214027 | A1* | 8/2010 | Sun | H03L 7/099 331/8 |
| 2013/0169373 | A1* | 7/2013 | Rehman | H03L 7/18 331/117 FE |
| 2013/0181783 | A1* | 7/2013 | Upadhyaya | H03B 5/1228 331/117 FE |
| 2018/0316310 | A1* | 11/2018 | Pentakota | H03B 5/1212 |

FOREIGN PATENT DOCUMENTS

KR 1020060012239 2/2016

* cited by examiner

*Primary Examiner* — Joseph Chang
(74) *Attorney, Agent, or Firm* — IPLA P.A.

(57) ABSTRACT

An LC oscillator capable of temperature compensation includes a differential voltage supplier providing a positive differential voltage to a positive node and a negative differential voltage to a negative node and a differential oscillation frequency signal output unit outputting a positive oscillation frequency signal using the positive differential voltage provided to the positive node by the differential voltage supplier and a negative oscillation frequency signal using the negative differential voltage provided to the negative node by the differential voltage supplier.

11 Claims, 2 Drawing Sheets

LC OSCILLATOR CAPABLE OF TEMPERATURE COMPENSATION

CROSS REFERENCE

This application is based on and claims priority under 35 U.S.C. 119 to Korean Patent Application No. 10-2019-0051422, filed on May 2, 2019, in the Korean Intellectual Property Office, the disclosures of which is herein incorporated by reference in their entireties.

BACKGROUND

The present disclosure relates to an LC oscillator capable of temperature compensation and, more particularly, to an LC oscillator capable of temperature compensation, which can be integrated into a silicon substrate because it does not include a separate crystal oscillator and is not sensitive to a temperature change.

An LC oscillator is a circuit including an inductor and capacitor and capable of controlling the frequency of an output signal based on a voltage of an input signal, and may be adopted in various integrated circuits, such as a phase-locked loop (PLL).

The PLL is applied to wireless communication systems and various products. It is very difficult to integrate the PLL into a silicon substrate because the PLL includes a crystal oscillator driven by an external quartz crystal.

Background Technology of the present disclosure has been disclosed in Korean Patent Application Publication No. 10-2006-0012239 disclosed on Feb. 7, 2006.

SUMMARY OF THE INVENTION

Accordingly, the present disclosure provides an LC oscillator capable of temperature compensation, which can be integrated into a silicon substrate because it does not include a separate crystal oscillator and is not sensitive to a temperature change.

Technical objects to be achieved in the present disclosure are not limited to the aforementioned technical objects, and other technical objects not described above may be evidently understood by a person having ordinary skill in the art to which the present disclosure pertains from the following description.

In an embodiment, an LC oscillator capable of temperature compensation includes a differential voltage supplier configured to provide a positive differential voltage to a positive node and provide a negative differential voltage to a negative node and a differential oscillation frequency signal output unit configured to output a positive oscillation frequency signal using the positive differential voltage provided to the positive node by the differential voltage supplier and output a negative oscillation frequency signal using the negative differential voltage provided to the negative node by the differential voltage supplier. The differential oscillation frequency signal output unit includes an inductor connected between the positive node and the negative node, a positive basic capacitor connected to the positive node, a negative basic capacitor connected between the positive basic capacitor and the negative node, a first positive varactor connected to the positive node and varied by a first control voltage, and a first negative varactor connected between the first positive varactor and the negative node and varied by the first control voltage.

In the LC oscillator capable of temperature compensation according to an embodiment of the present disclosure, the first control voltage is increased when a temperature is higher than a reference temperature.

In an embodiment, an LC oscillator capable of temperature compensation includes a differential voltage supplier configured to provide a positive differential voltage to a positive node and provide a negative differential voltage to a negative node and a differential oscillation frequency signal output unit configured to output a positive oscillation frequency signal using the positive differential voltage provided to the positive node by the differential voltage supplier and output a negative oscillation frequency signal using the negative differential voltage provided to the negative node by the differential voltage supplier. The differential oscillation frequency signal output unit includes an inductor connected between the positive node and the negative node, a positive basic capacitor connected to the positive node, a negative basic capacitor connected between the positive basic capacitor and the negative node, a first positive varactor connected to the positive node and varied by a first control voltage, a first negative varactor connected between the first positive varactor and the negative node and varied by the first control voltage, a second positive varactor connected to the positive node and varied by a second control voltage, and a second negative varactor connected between the second positive varactor and the negative node and varied by the second control voltage.

In the LC oscillator capable of temperature compensation according to another embodiment of the present disclosure, a variable range of the second positive varactor is smaller than a variable range of the first positive varactor.

In the LC oscillator capable of temperature compensation according to another embodiment of the present disclosure, a variable range of the second negative varactor is smaller than a variable range of the first negative varactor.

In the LC oscillator capable of temperature compensation according to another embodiment of the present disclosure, the first control voltage is increased when a temperature is higher than a reference temperature.

In the LC oscillator capable of temperature compensation according to another embodiment of the present disclosure, the second control voltage is increased when a temperature is higher than a reference temperature.

DETAILED DESCRIPTION

Figure 1:
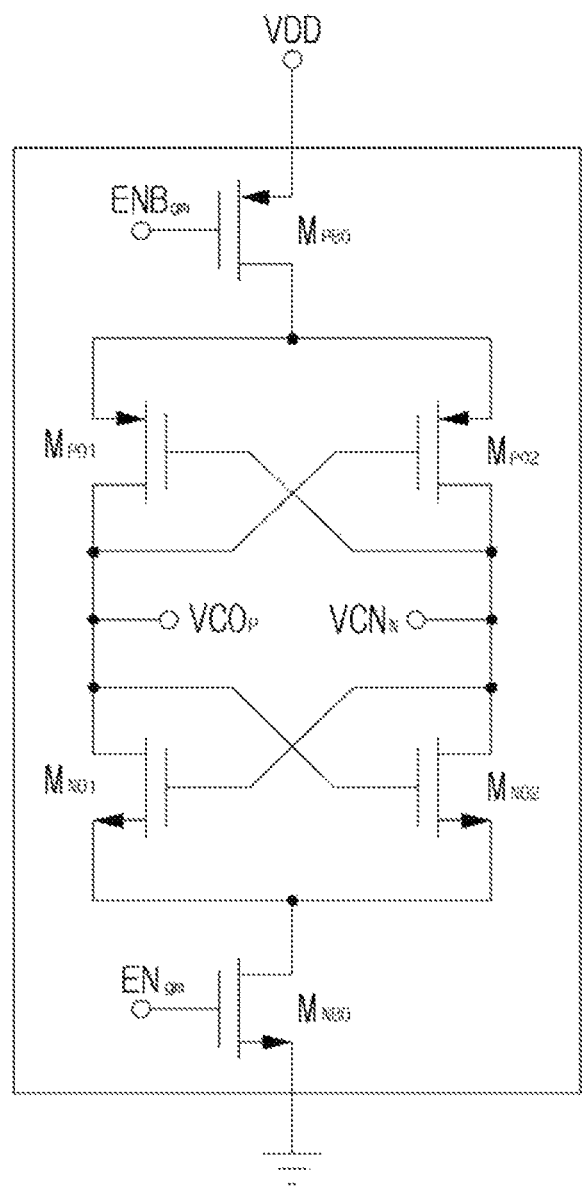
FIG. 1 is a circuit diagram of a differential voltage supplier of an LC oscillator capable of temperature compensation according to embodiments of the present disclosure.

The following detailed description of the present disclosure is an embodiment in which the present disclosure may be implemented, and reference is made to the accompanying drawings as an example of a corresponding embodiment. The embodiments are described in detail in order for those skilled in the art to readily implement the present disclosure.

It is to be noted that various embodiments of the present disclosure are different from each other, but do not need to be exclusive. For example, a specific shape, structure, and characteristic described in this specification may be implemented as another embodiment without departing from the spirit and scope of the present disclosure in relation to an embodiment. It is also to be understood that the position or arrangement of each element within each described embodiment may be changed without departing from the spirit and scope of the present disclosure.

Accordingly, the following detailed description is not intended to have a limited meaning. The range of the present disclosure is restricted by only the claims along with all ranges equivalent to that written in the claims if it is appropriately described. The same or similar reference numerals are used to denote the same or similar functions throughout the drawings.

Furthermore, Terms used in the detailed description are used to only describe the specific embodiments and are not intended to restrict the present disclosure. An expression of the singular number includes an expression of the plural number unless clearly defined otherwise in the context. In this application, terms, such as "include" or "have", are intended to designate that characteristics, numbers, steps, operations, elements, or parts which are described in the specification, or a combination of them exist, and should be understood that it does not exclude the existence or possible addition of one or more other characteristics, numbers, steps, operations, elements, parts, or combinations of them in advance All terms used herein, including technical terms or scientific terms, have the same meanings as those commonly understood by a person having ordinary skill in the art to which the present disclosure pertains. Terms, such as those commonly used and defined in dictionaries, should be construed as having the same meanings as those in the context of a related technology, and should not be construed as having ideal or excessively formal meanings unless explicitly defined otherwise in the specification.

Hereinafter, an LC oscillator capable of temperature compensation according to embodiments of the present disclosure is described with reference to FIGS. 1 and 2.

The LC oscillator capable of temperature compensation according to an embodiment of the present disclosure is configured with a differential voltage supplier configured to provide a positive differential voltage to a positive node (VCOP) and provide a negative differential voltage to a negative node (VCON) and a differential oscillation frequency signal output unit configured to output a positive oscillation frequency signal using the positive differential voltage provided to the positive node (VCOP) by the differential voltage supplier and output a negative oscillation frequency signal using the negative differential voltage provided to the negative node (VCON) by the differential voltage supplier.

Specifically, as illustrated in FIG. 1, the differential voltage supplier of the LC oscillator capable of temperature compensation according to an embodiment of the present disclosure includes a PMOS transistor (MPB0) enabled by a complementary voltage enable signal (ENBgm) to transmit a power supply voltage (VDD), PMOS transistors (MP01, MP02) having a drain and a gate cross-coupled between the PMOS transistor (MPB0) and the positive node (VCOP) and between the PMOS transistor (MPB0) and the negative node (VCON), respectively, an NMOS transistor (MNB0) enabled by a voltage enable signal (ENgm) and connected to a ground, and NMOS transistors (MN01, MN02) having a drain and a gate cross-coupled between the NMOS transistor (MNB0) and the positive node VCOP and between the NMOS transistor (MNB0) and the negative node (VCON), respectively.

Figure 2:
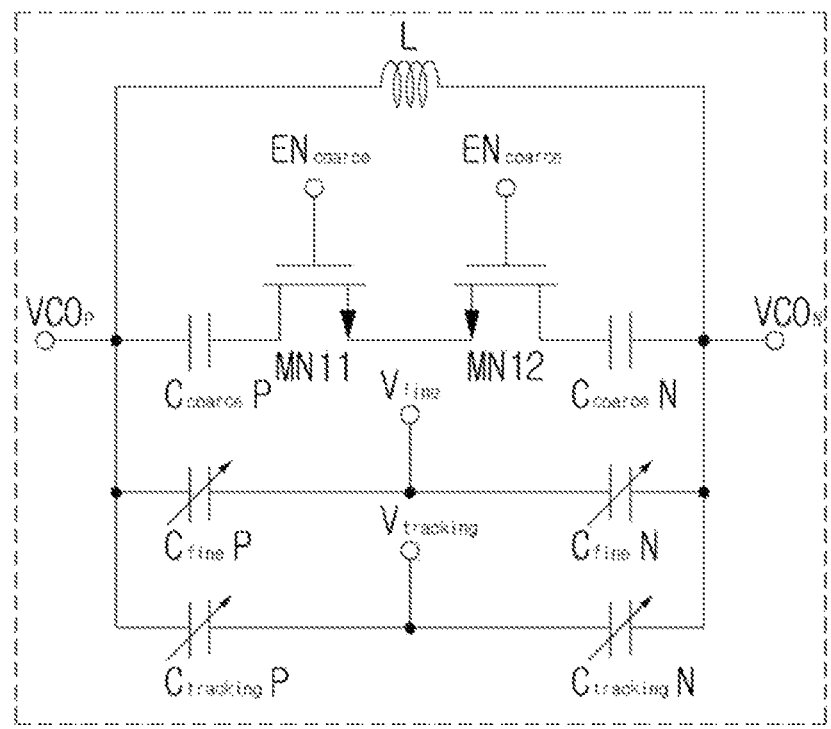
FIG. 2 is a circuit diagram of a differential oscillation frequency signal output unit of the LC oscillator capable of temperature compensation according to embodiments of the present disclosure.

As illustrated in FIG. 2, the differential oscillation frequency signal output unit of the LC oscillator capable of temperature compensation according to an embodiment of the present disclosure includes NMOS transistors (MN11, MN12) enabled by an output enable signal (ENcoarse), an inductor (L) connected between the positive node (VCOP) and the negative node (VCON), a positive basic capacitor (CcoarseP) connected to the positive node (VCOP), a negative basic capacitor (CcoarseN) connected between the positive basic capacitor (CcoarseP) and the negative node (VCON), a first positive varactor (CfineP) connected to the positive node (VCOP) and varied by a first control voltage (Vfine), and a first negative varactor (CfineN) connected between the first positive varactor (CfineP) and the negative node (VCON) and varied by the first control voltage (Vfine).

In this case, the first control voltage (Vfine) is increased when a temperature is higher than a reference temperature. For example, when the reference temperature is 25° C., a temperature constant is −1.64 mV/° C., and an increasing temperature is 10° C., the first control voltage (Vfine) is increased by 16.4 mV.

The LC oscillator capable of temperature compensation according to another embodiment of the present disclosure is configured with a differential voltage supplier configured to provide a positive differential voltage to the positive node (VCOP) and to provide a negative differential voltage to the negative node (VCON), and a differential oscillation frequency signal output unit configured to output a positive oscillation frequency signal using the positive differential voltage provided to the positive node (VCOP) by the differential voltage supplier and a negative oscillation frequency signal using the negative differential voltage provided to the negative node (VCON) by the differential voltage supplier.

Specifically, as illustrated in FIG. 1, the differential voltage supplier of the LC oscillator capable of temperature compensation according to another embodiment of the present disclosure includes the PMOS transistor (MPB0) enabled by the complementary voltage enable signal (ENBgm) to transmit the power supply voltage (VDD), the PMOS transistors (MP01, MP02) having a drain and a gate cross-coupled between the PMOS transistor (MPB0) and the positive node (VCOP) and between the PMOS transistor (MPB0) and the negative node (VCON), respectively, the NMOS transistor (MNB0) enabled by the voltage enable signal (ENgm) and connected to the ground, and the NMOS transistors (MN01 and MN02) having a drain and a gate cross-coupled between the NMOS transistor (MNB0) and the positive node (VCOP) and between the NMOS transistor (MNB0) and the negative node (VCON), respectively.

As illustrated in FIG. 2, the differential oscillation frequency signal output unit of the LC oscillator capable of temperature compensation according to another embodiment of the present disclosure includes the NMOS transistors (MN11, MN12) enabled by an output enable signal (ENcoarse), the inductor (L) connected between the positive node (VCOP) and the negative node (VCON), the positive basic capacitor (CcoarseP) connected to the positive node (VCOP), the negative basic capacitor (CcoarseN) connected between the positive basic capacitor (CcoarseP) and the negative node (VCON), the first positive varactor (CfineP) connected to the positive node (VCOP) and varied by a first control voltage (Vfine), the first negative varactor (CfineN) connected between the first positive varactor (CfineP) and the negative node (VCON) and varied by the first control voltage (Vfine), a second positive varactor (CtrackingP) connected to the positive node (VCOP) and varied by a second control voltage (Vtracking), and a second negative varactor (CtrackingN) connected between the second positive varactor (CtrackingP) and the negative node (VCON) and varied by the second control voltage (Vtracking).

In this case, a variable range of the second positive varactor CtrackingP is smaller than a variable range of the first positive varactor (CfineP). A variable range of the second negative varactor (CtrackingN) is smaller than a variable range of the first negative varactor (CfineN).

For example, when each of the positive basic capacitor (CcoarseP) and the negative basic capacitor (CcoarseN) is 20 fF and each of the variable range of the first positive varactor (CfineP) and the variable range of the first negative varactor (CfineN) is 100 fF, each of the variable range of the second positive varactor (CtrackingP) and the variable range of the second negative varactor (CtrackingN) may be set to 5 fF~20 fF.

The first control voltage (Vfine) is increased when a temperature is higher than a reference temperature. The second control voltage (Vtracking) is increased when a temperature is higher than the reference temperature.

For example, when the reference temperature is 25° C., a temperature constant is −1.64 mV/° C., and an increasing temperature is 10° C., each of the first control voltage (Vfine) and the second control voltage (Vtracking) is increased by 16.4 mV.

The LC oscillator capable of temperature compensation according to embodiments of the present disclosure can be integrated into a silicon substrate because it does not include a separate crystal oscillator, and is not sensitive to a temperature change by increasing a control voltage when a temperature increases.

Although the present disclosure has been described and shown in connection with the exemplary embodiments of the present disclosure for illustrating the technical spirit of the present disclosure, the present disclosure is not limited to only the shown and described configurations and operations.

Those skilled in the art to which the present disclosure pertains will appreciate that the present disclosure may be properly changed and modified in various ways without departing from the claims.

Accordingly, all such proper changes and modifications and equivalents thereof should be considered as falling within the scope of rights of the present disclosure.

What is claimed is:

1. An LC oscillator capable of temperature compensation, comprising:
   a differential voltage supplier configured to provide a positive differential voltage to a positive node and provide a negative differential voltage to a negative node; and
   a differential oscillation frequency signal output unit configured to output a positive oscillation frequency signal using the positive differential voltage provided to the positive node by the differential voltage supplier and output a negative oscillation frequency signal using the negative differential voltage provided to the negative node by the differential voltage supplier,
   wherein the differential oscillation frequency signal output unit comprises:
   an inductor connected between the positive node and the negative node;
   a positive basic capacitor connected to the positive node;
   a negative basic capacitor connected between the positive basic capacitor and the negative node, wherein the positive basic capacitor and the negative basic capacitor are connected through transistors enabled by an output enable signal, wherein transistors comprise only first and second transistors;
   a first positive varactor connected to the positive node and varied by a first control voltage; and
   a first negative varactor connected between the first positive varactor and the negative node and varied by the first control voltage.

2. The LC oscillator of claim 1, wherein the first control voltage is increased when a temperature is higher than a reference temperature.

3. An LC oscillator capable of temperature compensation, comprising
   a differential voltage supplier configured to provide a positive differential voltage to a positive node and provide a negative differential voltage to a negative node and a differential oscillation frequency signal output unit configured to output a positive oscillation frequency signal using the positive differential voltage provided to the positive node by the differential voltage supplier and output a negative oscillation frequency signal using the negative differential voltage provided to the negative node by the differential voltage supplier,
   wherein the differential oscillation frequency signal output unit comprises:
   an inductor connected between the positive node and the negative node;
   a positive basic capacitor connected to the positive node;
   a negative basic capacitor connected between the positive basic capacitor and the negative node, wherein the positive basic capacitor and the negative basic capacitor are connected through transistors enabled by an output enable signal, wherein transistors comprise only first and second transistors;
   a first positive varactor connected to the positive node and varied by a first control voltage;
   a first negative varactor connected between the first positive varactor and the negative node and varied by the first control voltage;
   a second positive varactor connected to the positive node and varied by a second control voltage; and
   a second negative varactor connected between the second positive varactor and the negative node and varied by the second control voltage.

4. The LC oscillator of claim 3, wherein a variable range of the second positive varactor is smaller than a variable range of the first positive varactor.

5. The LC oscillator of claim 3, wherein a variable range of the second negative varactor is smaller than a variable range of the first negative varactor.

6. The LC oscillator of claim 3, wherein the first control voltage is increased when a temperature is higher than a reference temperature.

7. The LC oscillator of claim 3, wherein the second control voltage is increased when a temperature is higher than a reference temperature.

8. The LC oscillator of claim 3, wherein the first and second transistors are NMOS transistors.

9. The LC oscillator of claim 1, wherein the first and second transistors are NMOS transistors.

10. An LC oscillator capable of temperature compensation, comprising:
    a differential voltage supplier configured to provide a positive differential voltage to a positive node and provide a negative differential voltage to a negative node; and a differential oscillation frequency signal output unit configured to output a positive oscillation frequency signal using the positive differential voltage provided to the positive node by the differential voltage supplier and output a negative oscillation frequency signal using the negative differential voltage provided to the negative node by the differential voltage supplier, wherein the differential oscillation frequency signal output unit comprises:

an inductor connected between the positive node and the negative node;

a positive basic capacitor connected to the positive node;

a negative basic capacitor connected between the positive basic capacitor and the negative node, wherein the positive basic capacitor and the negative basic capacitor are connected through transistors enabled by an output enable signal, wherein transistors comprises first and second transistors, wherein the first transistor comprises a first source terminal and the second transistor comprises a second source terminal, wherein the first and second source terminals are directly connected to each other such that current is allowed to flow from the first source terminal to the second source terminal;

a first positive varactor connected to the positive node and varied by a first control voltage; and a first negative varactor connected between the first positive varactor and the negative node and varied by the first control voltage.

11. The LC oscillator of claim 10, wherein transistors comprise only first and second transistors.

* * * * *